US008222966B2

(12) United States Patent
Ravi et al.

(10) Patent No.: US 8,222,966 B2
(45) Date of Patent: Jul. 17, 2012

(54) SYSTEM, METHOD AND APPARATUS FOR AN OPEN LOOP CALIBRATED PHASE WRAPPING PHASE MODULATOR FOR WIDEBAND RF OUTPHASING/POLAR TRANSMITTERS

(75) Inventors: Ashoke Ravi, Hillsboro, OR (US); Paolo Madoglio, Beaverton, OR (US); Marian Verhelst, Beaverton, OR (US); Georgios Palaskas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 34 days.

(21) Appl. No.: 12/879,152

(22) Filed: Sep. 10, 2010

(65) Prior Publication Data

US 2012/0062331 A1    Mar. 15, 2012

(51) Int. Cl.
*H03C 3/02* (2006.01)
*H03K 7/06* (2006.01)
*H04B 1/02* (2006.01)

(52) U.S. Cl. .......... 332/144; 375/271; 375/302; 455/42; 455/110

(58) Field of Classification Search ............. 332/144; 375/271, 302, 322; 455/23, 42, 110, 205, 455/208
See application file for complete search history.

(56) References Cited

U.S. PATENT DOCUMENTS

| 5,481,230 | A | * | 1/1996 | Chang et al. | 332/112 |
| 5,964,708 | A | * | 10/1999 | Freeman et al. | 600/447 |
| 6,731,667 | B1 | * | 5/2004 | Lee et al. | 375/130 |
| 7,869,769 | B2 | * | 1/2011 | Stengel et al. | 455/76 |
| 2004/0247041 | A1 | * | 12/2004 | Biedka et al. | 375/295 |
| 2009/0034603 | A1 | * | 2/2009 | Lakdawala et al. | 375/238 |
| 2011/0267120 | A1 | * | 11/2011 | Ravi et al. | 327/159 |

* cited by examiner

*Primary Examiner* — Levi Gannon
(74) *Attorney, Agent, or Firm* — Kacvinsky Daisak, PLLC (57) ABSTRACT

A device article and method for an open loop calibrated phase wrapping phase modulator. A tapped delay line may provide a coarse resolution for one or more phases of a signal. A phase multiplexer may receive one or more coarse phases from the tapped delay line and select a coarse phase to send to the digitally controlled delay line. A digitally controlled delay line may provide a fine resolution to the coarse phase from the phase multiplexer.

20 Claims, 9 Drawing Sheets

SYSTEM, METHOD AND APPARATUS FOR AN OPEN LOOP CALIBRATED PHASE WRAPPING PHASE MODULATOR FOR WIDEBAND RF OUTPHASING/POLAR TRANSMITTERS

BACKGROUND

Bottlenecks occur in a radio frequency transceiver as outphasing transmitters decompose a signal with amplitude and phase information A signal with amplitude and phase information may be decomposed into two constant-amplitude signals with only phase modulation.

Figure 1:
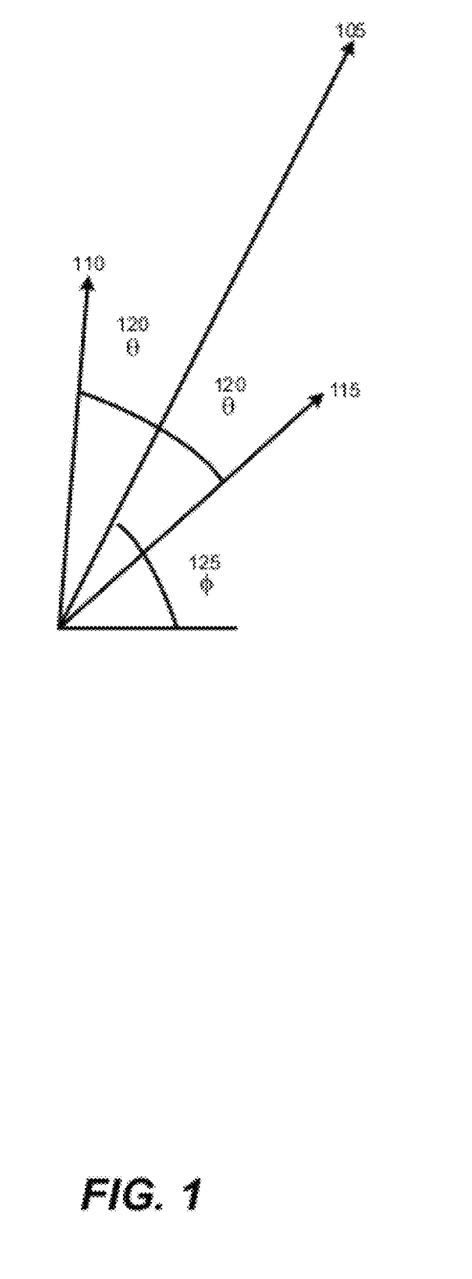
FIG. 1 illustrates one embodiment of a decomposed radio frequency (RF) modulation.

FIG. 1 illustrates an embodiment of a decomposed radio frequency (RF) modulation. The RF modulation signal is decomposed into the constituent phase modulated signals. The desired RF signal 105 may be decomposed into two equal amplitude signals 110, 115 with time—varying phases The amplitude and phase of the RF signal is controlled through the time varying differential phase (v) 120 and the common phase (ϕ) 125 respectively. Polar envelope elimination and restoration (EER) transmitters generate the same common phase signal (ϕ) 125 to drive the switching power amplifier. In this example, the amplitude information may be within the power amplifier by varying one or more of the supply, bias or number of unit devices.

Figure 2:
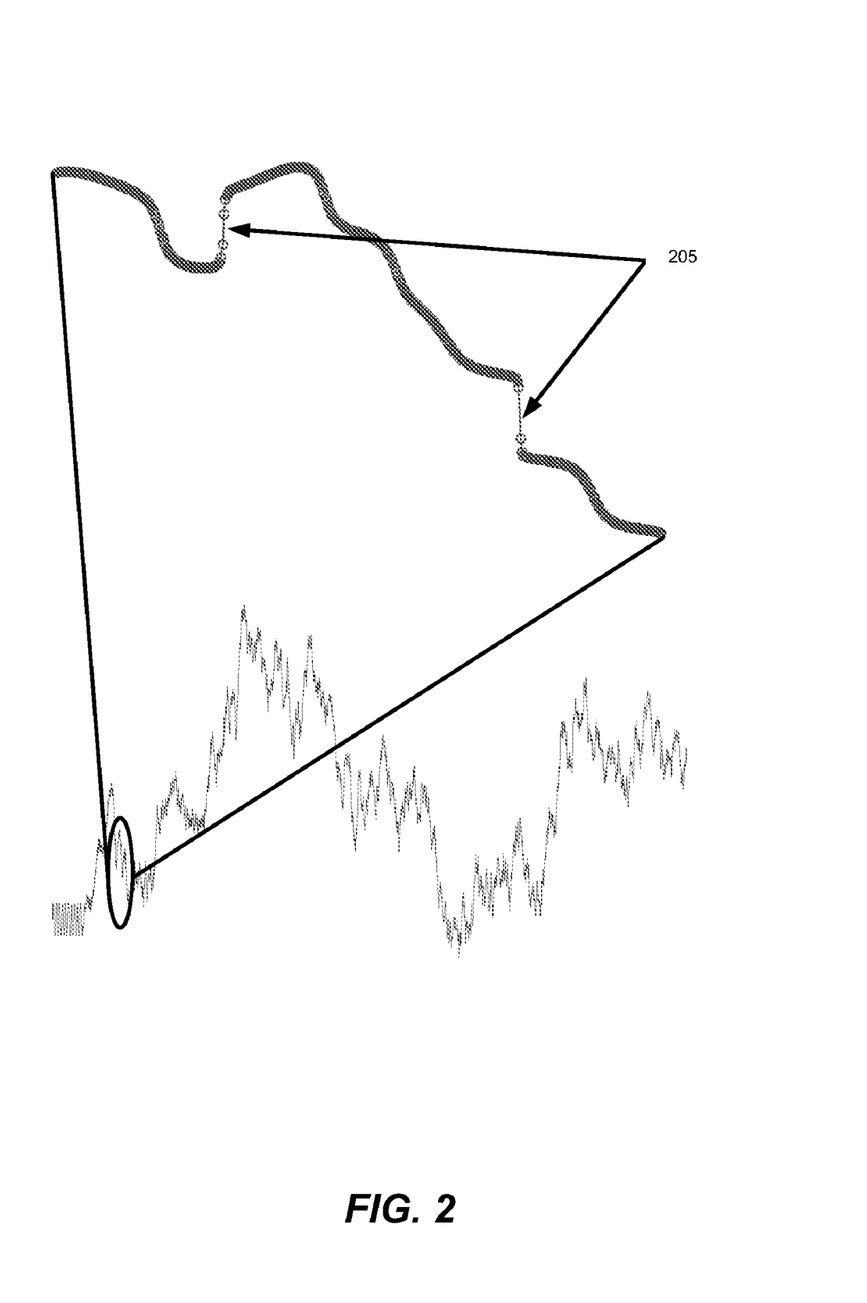
FIG. 2 illustrates one embodiment of a common phase signal for a typical high data-rate radio frequency modulation.

FIG. 2 illustrates one embodiment of a common phase signal for a typical high data-rate radio frequency modulation, such as an orthogonal frequency-division multiplexing (OFDM) modulation. As shown in FIG. 2, a common phase signal 200 may be an unbounded random walk with discontinuities 205. Consequently, there exists a substantial need for unbounded phase modulation generated with high resolution and wide bandwidths in order to achieve a good error vector magnitude (EVM) and spectral purity.

DETAILED DESCRIPTION

The embodiments are generally directed to techniques designed to generate a phase modulation signal with high efficiency that can be used in switching bar amplifiers. Various embodiments provide techniques that include an open loop calibrated phase wrapping modulator that can synthesize an unbounded phase while obtaining high resolution and wide bandwidth. A phase modulation signal may be portioned into one or more taps for each period. A coarse resolution may be applied to each tap of the phase modulation signal by a tapped delay line. A fine residual delay may be applied to each coarse tap by a digitally controlled delay line. Other embodiments are described and claimed.

Embodiments may include one or more elements. An element may comprise any structure arranged to perform certain operations. Each element may be implemented as hardware, software, or any combination thereof, as desired for a given set of design parameters or performance constraints. Although embodiments may be described with particular elements in certain arrangements by way of example, embodiments may include other combinations of elements in alternate arrangements.

It is worthy to note that any reference to "one embodiment" or "an embodiment" means that a particular feature, structure, or characteristic described in connection with the embodiment is included in at least one embodiment. The appearances of the phrases "in one embodiment" and "in an embodiment" in various places in the specification are not necessarily all referring to the same embodiment.

Figure 3:
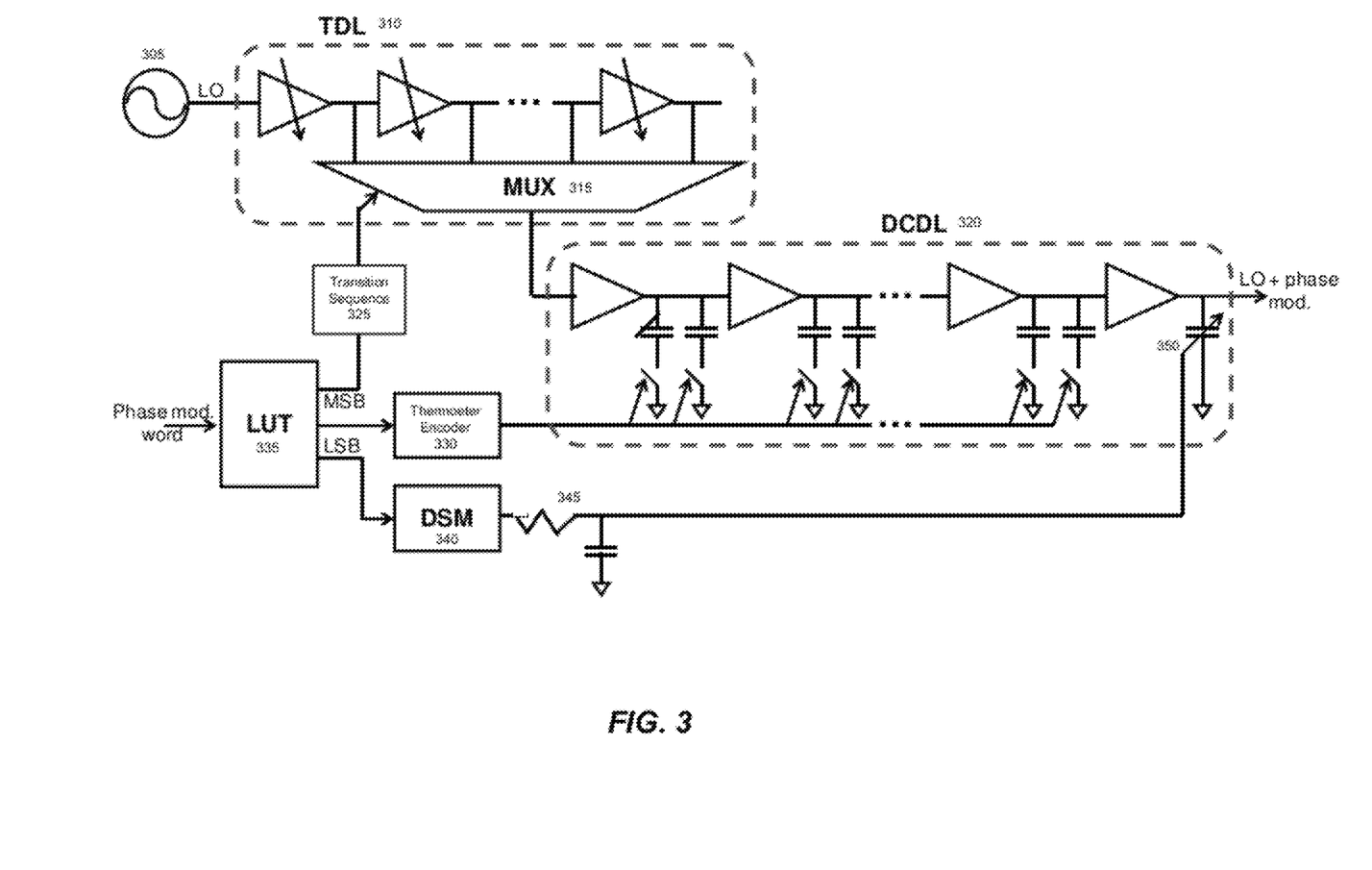
FIG. 3 illustrates one embodiment of a calibrated open loop wideband phase modulator for the common phase.

FIG. 3 illustrates one embodiment of a calibrated open loop wideband phase modulator for a common phase. The architecture of the phase modulator may synthesize a broad range of phases. The phase modulator may dynamically change the phase of a reference local oscillator (LO) 305 signal by accurately delaying its edges. The required delay for every individual LO 305 edge may be represented by a digital modulation signal. In an embodiment, the digital modulation signal may be computed by a CORDIC (Coordinate Rotation Digital Computer) algorithm used to calculate trigonometric function on chip. In an embodiment, the digital modulation signal may be implemented in hardware or software, or by a look-up-table (LUT).

The phase modulator may introduce delay in multiple stages. A first stage may be a coarse initial step. A second stage may be a fine adjustment. A third state may be a further fine adjustment or an ultra-fine adjustment. In an embodiment, a LO 305 may provide a signal to a tapped delay line (TDL) 310 for a coarse initial step which may correspond to the most significant bits of an input signal. The signal may be applied to a digitally controlled delay line (DCDL) 320 for a fine adjustment. The DCDL 320 may have finer resolution than the TDL 310 since it may use a bank of switched capacitors to dynamically increment or decrement the DCDL 320 delay by a small amount. In an embodiment, a variable delay controlled by a delta sigma modulator (DSM) 340 may be applied to the signal for a further refined adjustment. The least significant bits of the modulation signal may be sent to the DSM 340.

The TDL 310 may be locked into a 1 LO 305 period using a delay-locked loop. Locking the TDL 310 to one period of the LO signal 305 may provide a phase range of 0 to two pi. The TDL 310 may produce coarsely quantized phases. A phase multiplexer (MUX) 315 may be controlled by the most significant bits (MSBs) of the modulation signal from the TDL 310. The phase MUX 315 may select the closest coarse delay step.

The fine incremental delay adjustment may take place in a digitally controlled delay line (DCDL) 320. The DCDL 320 may have delay cells with banks of small capacitors and/or varactors that are switched on and/or off according to one or more least significant bits (LSBs) of the modulation signal. As a result, the delay of the DCDL 320 can be dynamically increased or decreased. This segmentation may allow a high phase resolution to be achieved.

It may be determined how many taps or phases it takes to partition a LO signal 305. The taps or phases may allow the period increments of a signal to be precisely controlled. In embodiment, the more taps, the more precisely controlled. In an embodiment, the number of taps may be limited by process technology. In an embodiment, the amount of taps or phases of the signal may meet one or more standard requirements. The TDL 310 may produce the most significant taps or phases while the DCDL 320 may produces the least significant taps or phases. The phases may be split into both TDL taps 310 and DCDL phases 320. For example, ten bits of input phases (1024 phases) may be split into three bits of TDL phases (8 phases) and seven bits of DCDL phases (128 phases).

For example, one signal may be divided into four TDL taps. The four taps may be ¼, ½, ¾ and 1. If a ⅜ phase modulation is to be synthesized, none of the four taps correspond exactly with ⅜. The TDL 310 may pick the lower tap (i.e., here the lower tap would be ¼) and then use the DCDL 320 to create the residue of ⅛ (i.e., ⅜-¼).

The DCDL 320 may be used to synthesize the residue phase modulation from the TDL. The DCDL 320 may synthesize more precise delays. In an embodiment, the DCDL 320 may have a constant delay. For example, the DCDL 320 may have a default delay of a 1 LO period. The DCDL 320 may change the 1 LO period to synthesize the fine delay. For example, the DCDL may change the 1 LO period to $9/8^{ths}$ of a LO period. Creating $9/8$ths of a LO period may effectively produce a phase modulation of $1/8^{th}$ of a period. The output of the TDL 310 (²⁄₈) plus the output of the DCDL 320 (⅛) may equal ⅜ths, which is the desired phase modulation. The DCDL may introduce the fine phase modulation by increasing its baseline delay in small increments. The constant baseline delay may have no impact on the operation of the phase modulator.

In an embodiment, since the DCDL 320 total incremental delay may be equal to a TDL 310 minimum step, in order to increment all possible delays, the DCDL 320 may require a huge number of capacitors to achieve accuracy. As a result, a Delta-Sigma Modulator (DSM) 340 may be used to represent the least significant bits to further refine the fine residual delay and/or create an ultra-fine delay. In an embodiment, the DSM 340 may further refine the fine residual delay by compressing least significant bits of the phase modulation signal. In an embodiment, the DSM 340 may compress the least significant bits of the modulation signal into a reduced set of one or more bits and may shift the quantization noise to frequencies higher than the signal bandwidth. The DSM 340 may further refine the fine residual resolution of the DCDL 320 by switching on and/or off a capacitor received by the digitally controlled delay line. The DSM 340 may control capacitors by quickly turning on and/or off capacitors to achieve an ultra fine delay resolution. For example, if $1/3^{rd}$ of DCDL step is to be created, out of every 3 LO cycles, the DSM 340 may turn off the DCDL capacitor 350 for two cycles and turn on the DCDL capacitor for one cycle to create a $1/3^{rd}$ value. This ability of the DSM to control the capacitors may allow the DSM to create an ultra-fine delay. In an embodiment, the DSM 340 may control capacitors by quickly turning on and/or off capacitors to achieve an ultra fine delay resolution.

In an embodiment, due to the noise created by the DSM 340, a resistor-capacitor (RC) filter 345 may be used. In an embodiment, the RC filter 345 may include a series resistor and a shunt capacitor. The RC filter 345 may be used to reduce the noise created by the DSM 345.

The DSM 340 may connect to the DCDL 320 through a variable capacitor 350. In an embodiment, the filtered DSM 340 output may tune an analog varactor placed in the last DCDL 320 stage for ultra-fine delay adjustment. In an embodiment, the DSM 340 may cause the variable capacitor 350 to switch on and/or off based on the ultra fine delay. For example, if $1/3^{rd}$ of DCDL step is to be created, out of every 3 LO cycles, the DSM 340 may turn off the DCDL capacitor 350 for two cycles and turn on the DCDL capacitor for one cycle to create a $1/3^{rd}$ value. This ability of the DSM to control the capacitors may allow the DSM to create an ultra-fine delay. In an embodiment, the DSM 340 may cause a switching capacitor within the DCDL 320 to be turned on and/or off based on the ultra fine delay. In an embodiment, the DSM may be used to avoid creating a DCDL with too many capacitors/varactors. The DSM may be used to switch on and/or off a capacitor or varactor placed in the last DCDL 320 stage to achieve a high accuracy of less than 1ps. For example, using the modulator described in FIG. 3, the error value magnitude and spectral emissions may be well below the transmission mask. Additionally, by using a DSM 340 in addition to the DCDL 320, a high phase resolution, such as may be necessary with, for example, WiMax, may be achieved.

Figure 4:
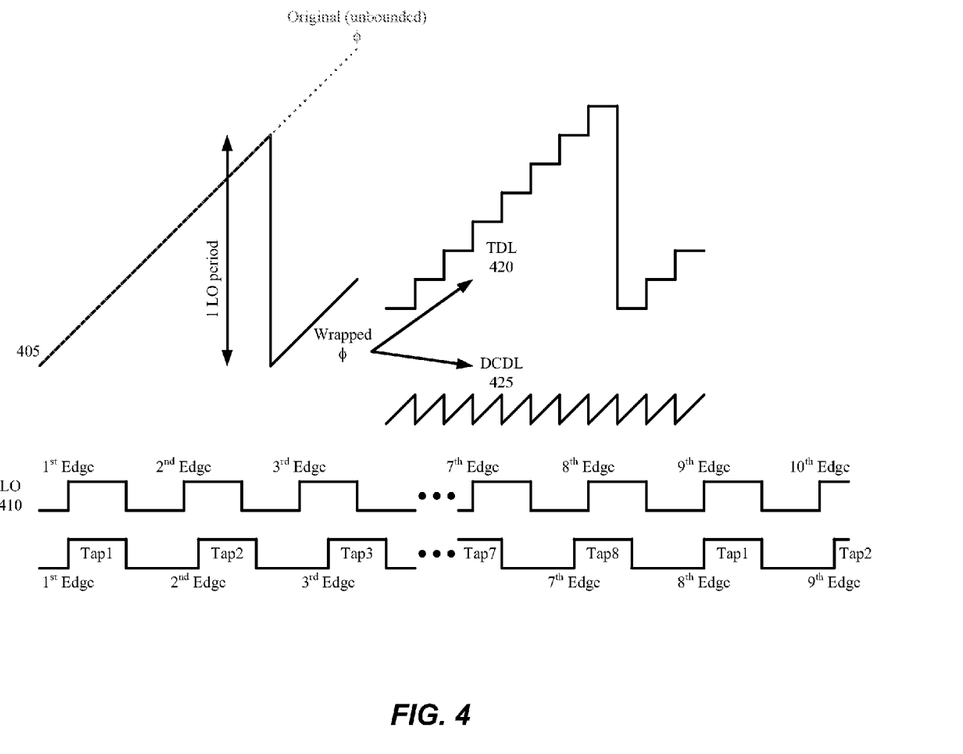
FIG. 4 illustrates one embodiment of phase wrapping to synthesize an unbounded phase.

FIG. 4 illustrates one embodiment of phase wrapping to synthesize an unbounded phase. In FIG. 4, the TDL output 420 illustrates a more detailed embodiment of the transition sequence 325 of FIG. 3. In an embodiment, the phase may be wrapped when the unbounded phase 405 exceeds two pi. In the time domain, the phase wrapping may be implemented by swallowing an edge. FIG. 4 shows the swallowing of an edge when comparing the LO output waveform 410 and the TDL output waveform 415. Initially, corresponding edges of the LO output 410 waveform and the TDL output waveform 415 may be aligned. Switching from a first TDL tap to a second TDL tap, the output period is stretched. For example, at Tap 2, the second edge of the LO output signal 410 is ahead of the second edge of the TDL output signal 415. In an embodiment, as the taps continue, more delay may be added. By Tap 8, the event edge of the TDL output 415 may be almost aligned with the eighth edge of the LO output signal 410. As shown in this example, the delayed edge of the TDL output signal relative to the LO output signal may have a delay of almost a period by the end of the taps and or phases of a period. In an embodiment, there may be only one change per period (i.e., it may be either stretched or reduced over the course of the period). In an embodiment, the stretching or shrinking may occur with a finite number of taps or phases within the TDL.

In an embodiment, when a signal has an unbounded phase, the TDL taps may be wrapped around circularly. For example, referring back to FIG. 3, the TDL 310 may have eight taps. Each tap of the TDL may represent a portion of a period. For example, with an 8 tap TDL, each tap represents $1/8^{th}$ of a period. To stretch the period, each of the eight taps may be incremented from edge to edge until the final tap is reached (as shown in FIG. 4). After the final tap (Tap 8) is reached, the tap selection may be wrapped or circularly rotated back to TDL 320 Tap 1. Each subsequent tap selection may continue to be incremented. In an embodiment, many periods of phase modulation may be spanned. By controlling the sequence of the taps in the TDL, the periods can be stretched or reduced. By sequencing the transitions between the TDL phases, the desired stretching (optionally swallowing edges) or shrinking (optionally inserting edges) of a period may be achieved without introducing glitches. As shown in FIG. 4, the DCDL output 425 may contribute the fine residual delay and compensate for the TDL tap output 420.

When a TDL tap selection is changed (i.e., when the TDL increases from one tap to a second tap), the DCDL may compensate for the discontinuity instantaneously to ensure a smooth phase trajectory and to avoid imperfect reconstruction of the phase modulation. As discussed further in FIG. 6, the delay span of the DCDL may be set equal to the delay span of each TDL tap to compensate for the discontinuity. In an embodiment, the open loop nature of the modulator may facilitate a smooth phase trajectory.

Figure 5:
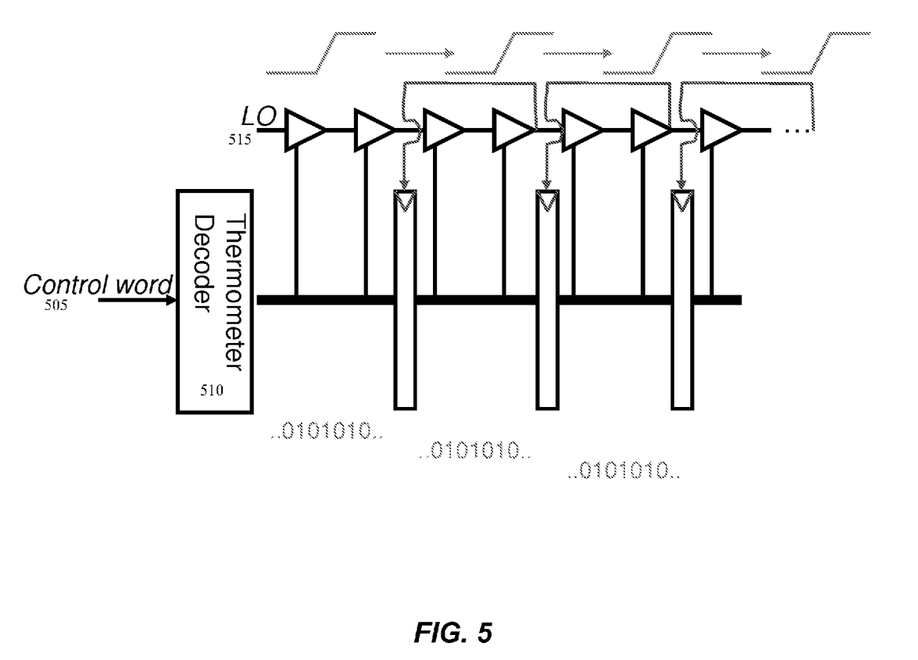
FIG. 5 illustrates one embodiment of retiming circuitry in the DCDL to properly propagate data along with local oscillator signal edges.

FIG. 5 illustrates one embodiment of retiming circuitry in the DCDL to properly propagate data along with local oscillator signal edges. FIG. 5 illustrates a more detailed embodiment of the thermometer encoder/decoder 330 of FIG. 3. To ensure a linear relationship between a control word 505 and the fine residual delay of the DCDL, the switched small capacitors may be distributed thermometrically among several identical delay stages using a thermometer decoder 510. A control word 505 may control the phase modulation applied by a DCDL. The fine residual delay originating from a particular tap or phase may be applied on the same edge in all DCDL stages. Since the total delay of the DCDL is often longer than the period of the LO 515, the phases or taps may be internally retimed. In an embodiment, wavepipelining control data to propagate along the edges rippling through the DCDL may be applied. In an embodiment, retiming circuitry in the DCDL may ensure that the fine residual delay originating from a particular control word 505 may be applied on the same edge in all DCDL stages.

Referring back to FIG. 3, in an embodiment, the phase MUX 315 may select a phase between 0 and 2 pi. In an embodiment, there may be 4 taps. If the first tap (Tap ¼) is selected, then the TDL may remain at Tap ¼ until the next tap is required (Tap ½). While the TDL remains at Tap ¼ the DCDL may be incremented. However, when the TDL may step to the next tap (Tap ½), the DCDL may need to begin again at 0. In an embodiment, the DCDL may need to be at the starting point, 0, each time the TDL increases its tap. Accordingly, the delay of the DCDL may be calibrated to span exactly one tap of a TDL. The calibration process may measure a delay range of the TDL and the DCDL.

If the DCDL covers a delay range greater than a tap of the TDL, then mapping may be created. For example, a signal may have four taps (¼, ⅛, ¾, 1). However, due to manufacturing variations, 0.3 may be synthesized instead of 0.25 in the TDL. As a result, mapping may be modified in DCDL based on the actual measurements of the TDL. The TDL and the DCDL may take into account data generated by a calibration and predistortion circuit.

Figure 6:
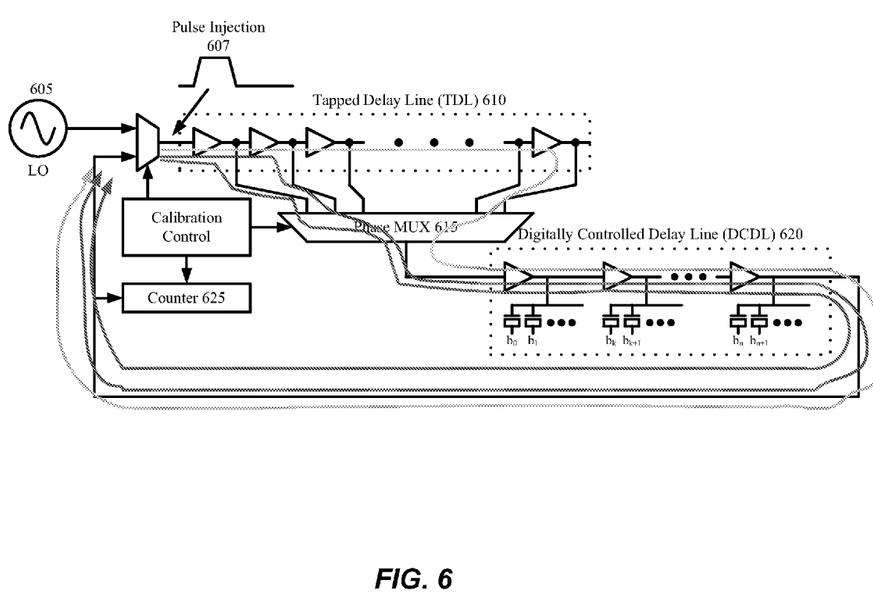
FIG. 6 illustrates one embodiment of a calibration procedure to compute mismatches within the TDL taps and between the TDL taps and DCDL delay span.

FIG. 6 illustrates one embodiment of a calibration procedure to compute mismatches within the TDL taps and between the TDL taps and DCDL delay span. FIG. 6 illustrates a more detailed embodiment of the mismatch calibration circuit of FIG. 3. The information from this calibration step is used to populate the look-up table (LUT) of FIG. 3.

In an embodiment, the calibration circuit may measure each phase or tap in the TDL as well as the total DCDL delay span. In order to avoid glitches, the total DCDL incremental delay may span a TDL delay step. Mismatches between the TDL taps and differences between the TDL steps and the DCDL incremental delay span may result in non-monotonicity or gaps in the modulator transfer characteristics from one phase or tap to another phase or tap. When there is a mismatch between the TDL taps and the fine residual delay created by the DCDL, a degraded error vector magnitude and spectral mask performance may occur. To obtain good modulation quality, the DCDL may be designed to span a delay range larger than the worst case TDL tap delay (with process and frequency). Good modulation quality may be measured by the error vector magnitude (EVM) and/or spectral emissions adjacent channel power ratio (ACPR). The TDL delays may be measured by selecting one TDL tap at a time and looping the output back to the input of the TDL.

Referring to FIG. 6, the output of the phase modulator may be looped back into the input. A pulse 607 may be injected into the TDL 610 using an LO signal 605. The pulse 607 may be injected into the loop to recirculate through it as a waveform with a frequency inversely proportional to the delays in the loop. The calibration may step through the different taps using a counter 625 to measure the waveform frequency. The counter 625 may measure the frequency of oscillation. The tap delay may be extracted by comparing the frequency of oscillations measured from successive taps.

In an embodiment, the DCDL 620 may be used with a minimum delay setting in the calibration loop to measure the TDL 610 tap delays. By including an additional delay measurement with the DCDL 620 in the maximum tap delay setting, the number of DCDL 620 incremental delays required to span each TDL 610 tap may be computed.

For example, the pulse 607 may be circulated through one tap in the TDL 610. If the phase is again divided into fourths, the output of the phase MUX 615 may be the same pulse 607 but shifted in time by ¼ due to the delay of Tap 1. The output of the DCDL 620 may be the combination of the additional delay as a result of the DCDL, the Tap 1 delay and the phase MUX 615 delay. The counter 625 may be increased and the pulse may be inserted back into the TDL 610 after.

After the multiplexed pulse cycles through both the TDL 610 and the DCDL 620, the delay of the output signal may be a combination of the additional delay as a result of the DCDL, the Tap 2 delay and the phase MUX 615 delay. The total loop delay selecting Tap 2 may then be determined to be the total delay of the loop selecting Tap 1 plus the internal delay of Tap 2. By comparing these subsequent measurements the delay of each tap of the TDL may be measured. By comparing the loop delay when selecting the previous tap to the delay when selecting the following tap, it may be determined how much delay is added by each TDL tap. In an embodiment, a look-up table (LUT) may store the sequential measurements to determine the TDL delay at each tap.

In an embodiment, the DCDL 620 delay span may be estimated in a similar manner. The LUT may also store sequential measurements to determine a DCDL delay at each tap. The delay of the DCDL may be measured by keeping the tap of the TDL constant.

In an embodiment, at run time, a look-up table (LUT) may be constructed from this calibration step. The LUT may dynamically map the phase modulation input into an appropriate combination of TDL and DCDL settings. By using the LUT, the LO signal may be able to be correctly delayed by the TDL and DCDL. In an embodiment, instead of using the LUT, the delay of a fixed number of DCDL taps may be adjusted so that they are ½ÔN of the TDL tap.

Figure 7:
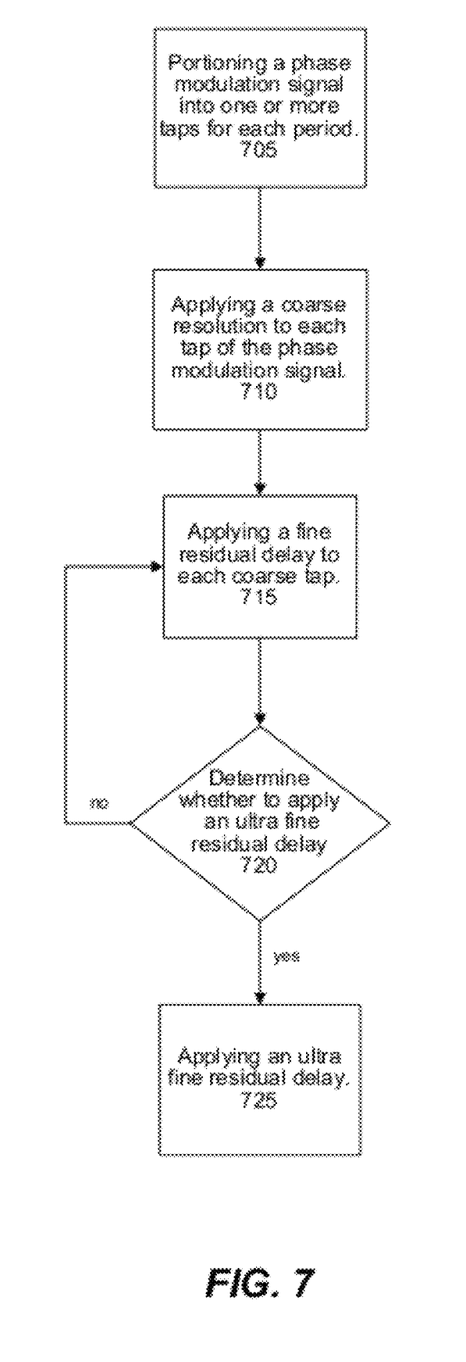
FIG. 7 illustrates one embodiment of a logic flow.

FIG. 7 illustrates one embodiment of a logic flow 700. The logic flow 700 may be performed by various systems and/or devices and may be implemented as hardware, software, firmware, and/or any combination thereof, as desired for a given set of design parameters or performance constraints. For example, one or more operations of the logic flow 700 may be implemented by executable programming or computer-readable instructions to be executed by a logic device (e.g., computer, processor). Logic flow 700 may describe the features described above with reference to apparatus 100.

A phase modulation signal may be portioned 705 into one or more taps or phases for each period. A coarse resolution may be applied 710 to each tap of the phase modulation signal. A fine residual delay may be applied 715 to each coarsely modulated tap. In an embodiment, a phase of a reference local oscillator signal may be adjusted by delaying its edges. In an embodiment, capacitors may switch on and/or off according to one or more least significant taps of the phase modulation signal. Applying a fine residual delay to each coarse tap may increment or decrement delay dynamically. In an embodiment, the fine residual delay may be applied throughout each tap of the applied coarse resolution. In an embodiment, applying a fine delay may compensate for the coarse tap. In an embodiment, discontinuity may be instantly compensated for when a new coarse tap is applied. In an embodiment, when the phase modulation signal is an unbounded phase modulation signal, a first tap may be re-circulated after a fine residual delay is applied to a last tap.

It may be determined 720 whether to apply an ultra fine residual delay. In one embodiment, it may be determined whether a delay span of the fine residual delay is equal to a delay span of the phase of the coarse resolution.

In an embodiment, an ultra fine residual delay may be applied 725. An ultra fine residual delay may be applied when it is not possible to obtain a good modulation quality. When the delay span of the fine residual delay is less than the delay span of the phase of the coarse resolution, an ultra fine residual delay may be applied. An ultra fine residual delay may be applied through delta sigma modulation in order to implement all possible delays as the DCDL would need to have a high number of capacitors in order to create a very fine delay with accuracy of at least 1ps.

Figure 8A:
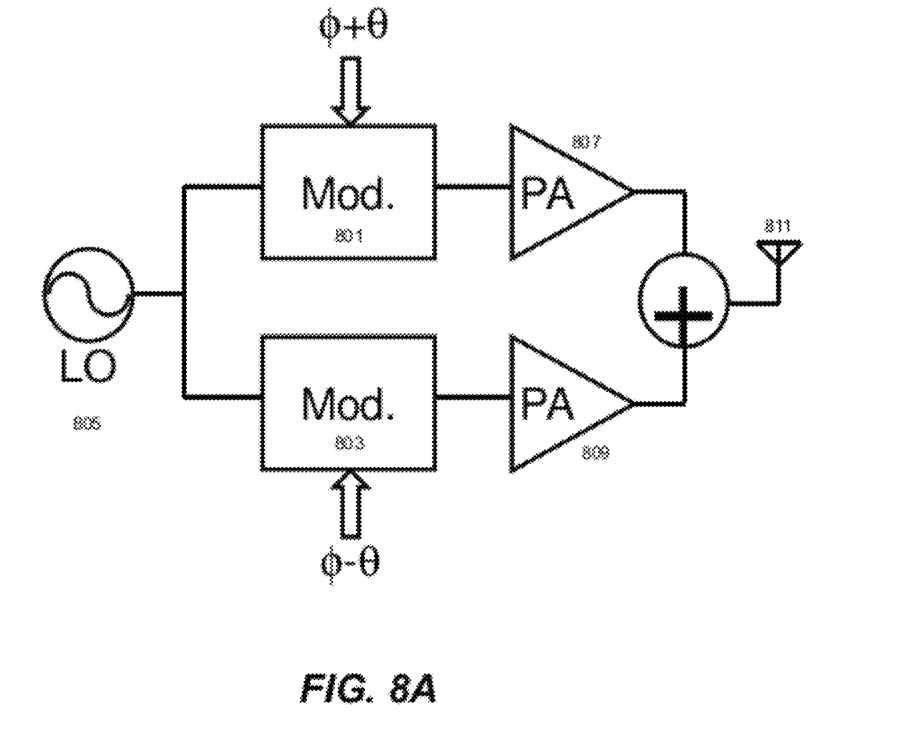
FIGS. 8A and 8B each illustrate one embodiment of an application of the calibrated open loop wideband phase modulator in a radio frequency transmitter.
Figure 8B:
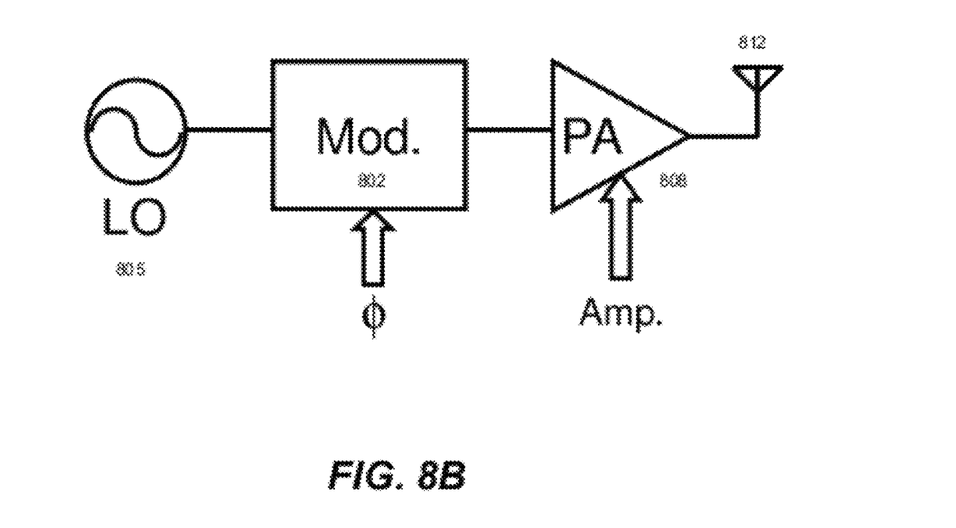

FIGS. 8A and 8B each illustrate one embodiment of an application of the calibrated open loop wideband phase modulator in a radio frequency transmitter. In both FIGS. 8A and 8B, bounded and unbounded modulations may be handled with high accuracy.

In FIG. 8A, illustrates on embodiment of an application of the calibrated open loop wideband phase modulator in an out-phasing radio frequency transmitter. In an embodiment, FIG. 8A illustrates an amplitude and a common phase as two out-phasing components. In an embodiment, a signal from the LO 805 may be sent to a modulator 801 where the common phase is added to the differential phase and a modulator 803 where the differential phase is subtracted from the common phase. The output of the modulator 801 where the common phase is added to the differential phase may be sent to a power amplifier 807. The output of the modulator 803 where the differential phase is subtracted from the common phase may be sent to a power amplifier 809. In an embodiment, one or more of the power amplifiers may be switching power amplifiers to ensure increased efficiency. The outputs from the power amplifiers 807, 809 may be added together and sent to an antenna 811 to transmit an amplitude and phase modulated output signal.

FIG. 8B illustrates on embodiment of an application of the calibrated open loop wideband phase modulator in a polar radio frequency transmitter. In an embodiment, a single modulator may be applied in a communication system without amplitude modulation such as, but not limited to, Bluetooth. In an embodiment, a signal from the LO 805 may be sent to a modulator 802 for the common phase. The output of the modulator 802 may be sent to the power amplifier 808. The output of the power amplifier may be sent to an antenna 812 to transmit an output signal.

Figure 9:
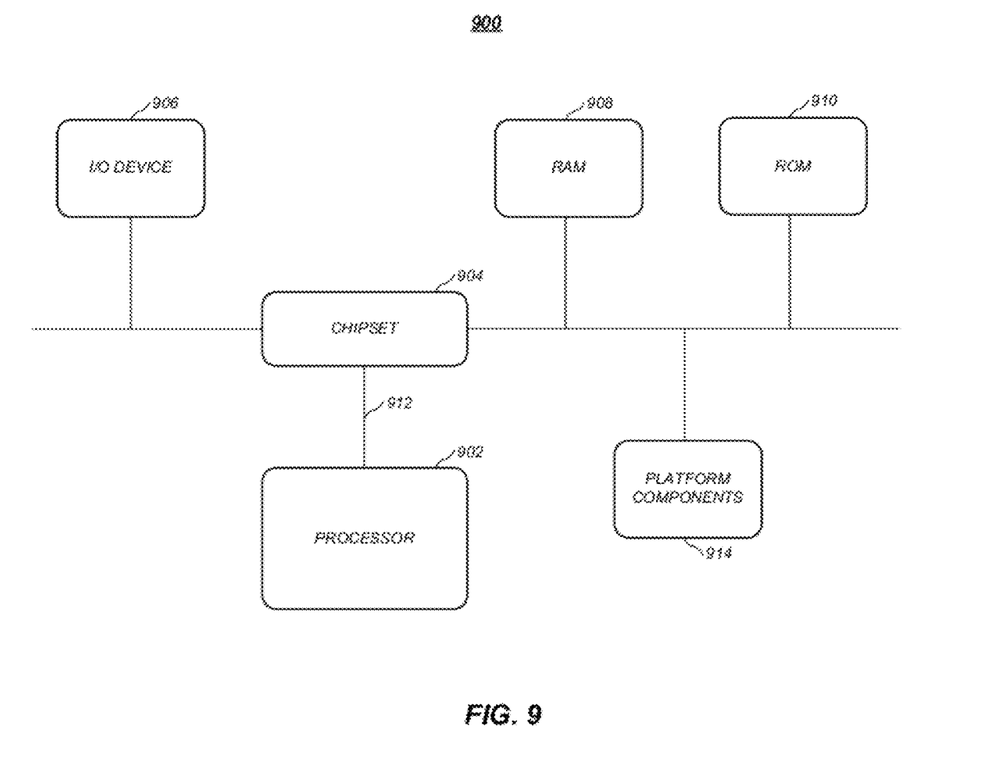
FIG. 9 illustrates one embodiment of a system.

FIG. 9 is a diagram of an exemplary system embodiment. In particular, FIG. 9 is a diagram showing a system 900, which may include various elements. For instance, FIG. 9 shows that system 900 may include a processor 902, a chipset 904, an input/output (I/O) device 906, a random access memory (RAM) (such as dynamic RAM (DRAM)) 908, and a read only memory (ROM) 910, and various platform components 914 (e.g., a fan, a crossflow blower, a heat sink, DTM system, cooling system, housing, vents, and so forth). These elements may be implemented in hardware, software, firmware, or any combination thereof. The embodiments, however, are not limited to these elements.

As shown in FIG. 9, I/O device 906, RAM 908, and ROM 910 are coupled to processor 902 by way of chipset 904. Chipset 904 may be coupled to processor 902 by a bus 912. Accordingly, bus 912 may include multiple lines.

Processor 902 may be a central processing unit comprising one or more processor cores and may include any number of processors having any number of processor cores. The processor 902 may include any type of processing unit, such as, for example, central processing unit (CPU), multi-processing unit, a reduced instruction set computer (RISC), a processor that have a pipeline, a complex instruction set computer (CISC), a digital signal processor (DSP), and so forth.

Although not shown, the system 900 may include various interface circuits, such as an Ethernet interface and/or a Universal Serial Bus (USB) interface, and/or the like. In some exemplary embodiments, the I/O device 906 may comprise one or more input devices connected to interface circuits for entering data and commands into the system 900. For example, the input devices may include a keyboard, mouse, touch screen, track pad, track ball, isopoint, a voice recognition system, and/or the like. Similarly, the I/O device 906 may comprise one or more output devices connected to the interface circuits for outputting information to an operator. For example, the output devices may include one or more displays, printers, speakers, and/or other output devices, if desired. For example, one of the output devices may be a display. The display may be a cathode ray tube (CRTs), liquid crystal displays (LCDs), or any other type of display.

The system 900 may also have a wired or wireless network interface to exchange data with other devices via a connection to a network. The network connection may be any type of network connection, such as an Ethernet connection, digital subscriber line (DSL), telephone line, coaxial cable, etc. The network may be any type of network, such as the Internet, a telephone network, a cable network, a wireless network, a packet-switched network, a circuit-switched network, and/or the like.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Some embodiments may be implemented, for example, using a machine-readable or computer-readable medium or article which may store an instruction, a set of instructions or computer executable code that, if executed by a machine or processor, may cause the machine or processor to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, volatile or non-volatile memory or media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter that lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first,'" "second," and "third," etc. are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A modulator comprising:
    a tapped delay line to provide a coarse resolution for one or more phases of an unbounded phase modulation signal;
    a digitally controlled delay line to provide a fine resolution to a coarse phase from the tapped delay line based on one or more least significant bits of the unbounded phase modulation signal; and
    a look up table to calibrate delay of the tapped delay line and the digitally controlled delay line.

2. The device of claim 1, further comprising:
    a phase multiplexer to receive the one or more coarse phases from the tapped delay line and select a coarse phase to send to the digitally controlled delay line.

3. The device of claim 1, wherein the digitally controlled delay line further comprises providing the fine resolution to a coarse phase to span the tapped delay line phase in order to avoid a glitch.

4. The device of claim 1, further comprising:
    a thermometer encoder to retime circuitry in the digitally controlled delay line.

5. The device of claim 1, further comprising:
    a delta sigma modulator to further refine the fine resolution of the digitally controlled delay line by switching on and off a capacitor received by the digitally controlled delay line.

6. The device of claim 5, further comprising:
    a resistor-capacitor filter to reduce the noise created by the delta sigma modulator.

7. The device of claim 1 wherein the digitally controlled delay line is further configured to generate the unbounded phase signal with a high resolution and wide bandwidth.

8. The device of claim 1, further comprising:
one or more calibration circuits configured to segment the signal into the one or more phases sent to the tapped delay line and the digitally controlled delay line.

9. A modulator comprising:
a tapped delay line to provide a coarse resolution for one or more phases of a signal;
a phase multiplexer to receive one or more coarse phases from the tapped delay line and select a coarse phase to send to a digitally controlled delay line, the digitally controlled delay line to provide a fine resolution to the coarse phase from the phase multiplexer based on one or more least significant bits of the signal, wrap the phase back to the tapped delay line and repeat the one or more phases to synthesize an unbounded phase modulation signal.

10. The device of claim 9 wherein the digitally controlled delay line is further configured to generate the unbounded phase modulation signal with a high resolution and wide bandwidth.

11. The device of claim 9, further comprising:
a delta sigma modulator to further refine the fine resolution of the digitally controlled delay line by switching on and off a capacitor received by the digitally controlled delay line.

12. The device of claim 9 wherein the digitally controlled delay line comprises one or more capacitors configured to switch on and off according to the one or more least significant bits of the signal.

13. The device of claim 9, further comprising:
one or more calibration circuits configured to segment the signal into the one or more phases sent to the tapped delay line and the digitally controlled delay line.

14. The device of claim 9, further comprising:
a look up table to calibrate delay of the tapped delay line and the digitally controlled delay line.

15. A method comprising:
applying a coarse resolution to each phase of a phase modulation signal via a tapped delay line;
applying a fine residual delay to each coarse phase based on one or more least significant bits of the phase modulation signal; and
circulating back to a first phase after the fine residual delay is applied to a last phase to synthesize an unbounded phase modulation signal.

16. The method of claim 15 wherein applying a fine residual delay to each coarse phase comprises adjusting a phase of a reference local oscillator signal by delaying its edges.

17. The method of claim 15, further comprising:
determining whether a length of the fine delay is equal to a length of the phase of the coarse resolution; and
applying an ultra fine delay when the length of the fine delay is less than the length of the phase of the coarse resolution.

18. The method of claim 15 wherein applying the fine residual delay to each coarse phase comprises switching capacitors on or off according to the one or more least significant bits of the phase modulation signal.

19. The method of claim 15 wherein applying the fine residual delay to each coarse phase comprises applying the fine residual delay throughout each tap of the applied coarse resolution.

20. The method of claim 15 further comprising refining the fine residual delay to compress the one or more least significant bits of the phase modulation signal.

* * * * *